United States Patent [19]

Baker

[11] Patent Number: 4,658,264

[45] Date of Patent: Apr. 14, 1987

[54] FOLDED RF MARKER FOR ELECTRONIC ARTICLE SURVEILLANCE SYSTEMS

[75] Inventor: Dennis L. Baker, St. Joseph Township, St. Croix County, Wis.

[73] Assignee: Minnesota Mining and Manufacturing Company, St. Paul, Minn.

[21] Appl. No.: 669,752

[22] Filed: Nov. 9, 1984

[51] Int. Cl.$^4$ .................. H01Q 1/36; H03H 7/01
[52] U.S. Cl. ........................... 343/895; 540/572
[58] Field of Search .............. 340/572; 343/895; 333/175, 176

[56] References Cited

U.S. PATENT DOCUMENTS

| | | | |
|---|---|---|---|
| 3,810,147 | 5/1974 | Lichtblau | 340/280 |
| 3,863,244 | 1/1975 | Lichtblau | 340/280 |
| 3,913,219 | 10/1975 | Lichtblau | 29/592 |
| 3,967,161 | 6/1976 | Lichtblau | 317/101 R |
| 4,021,705 | 5/1977 | Lichtblau | 361/402 |
| 4,369,557 | 1/1983 | Vandebult | 29/25.42 |

FOREIGN PATENT DOCUMENTS

WO83/01697  5/1983  PCT Int'l Appl. .

Primary Examiner—Eli Lieberman
Attorney, Agent, or Firm—Donald M. Sell; James A. Smith; William B. Barte

[57] ABSTRACT

A tuned resonant circuit including inductive and capacitive components useful as a marker in electronic article surveillance systems, comprising a laminate of a dielectric sheet having a conductive layer on one side configured to form at least one multi-turn inductive spiral. The sheet is folded back upon itself at a fold line which is precisely defined by spaced apart areas of the conductive layer such that desired portions of the layer become precisely and uniformly juxtaposed.

24 Claims, 4 Drawing Figures

FOLDED RF MARKER FOR ELECTRONIC ARTICLE SURVEILLANCE SYSTEMS

FIELD OF THE INVENTION

This invention relates to tuned resonant electrical circuits including an inductive and capacitive component, such as are useful as a marker in electronic article surveillance systems, and in particular, to such circuits in which the inductor is a flat conductive spiral such as formed of metal foil or conductive paint applied to a flexible dielectric sheet, and the capacitor is formed by the same sheet in combination with conductive areas on opposing surfaces thereof.

DESCRIPTION OF THE PRIOR ART

Numerous configurations of resonant tag or marker circuits have been previously disclosed. For example, in U.S Pat. No. 3,810,147 (Lichtblau) such a circuit is shown to include a dielectric sheet having an inductive spiral positioned on one side thereof, such as an appropriately configured metal foil, which is terminated at each end by first and second conductive areas. Matching conductive areas are provided on the opposite side of the dielectric sheet, which areas combine with the sandwiched sheet to form two capacitors, thus completing an inductive-capacitive tuned resonant circuit. Similar circuits are further depicted in subsequent patents of Lichtblau (U.S. Pat. Nos. 3,863,244; 3,913,219; 3,967,161 and 4,021,705), such patents further disclosing the formation of a direct electrical connection between conductive areas on both sides of a dielectric sheet, such as via a pin, eyelet or weld formed by melting directly through the dielectric sheet.

Another modification of such a resonant circuit is depicted in U.S. Pat. No. 4,369,557 (Vandebult), FIGS. 5-8 of which depict constructions in which the need for an electrical connection through a dielectric sheet is obviated by a technique in which two inductive spiral patterns and electrical connections therebetween are provided on the same side of a dielectric sheet, and the sheet is thereafter folded over such that appropriate conductive areas become opposed to each other to form matching capacitor plates with a portion of the dielectric sheet sandwiched therebetween. In FIGS. 6 and 7 thereof, the dielectric sheets are depicted to have on one surface an inductive pattern having first and second portions on opposite sides of a fold line, with each portion terminating at a conductive area. The sheets are then to be folded over along the fold line to align the conductive areas. Such an embodiment is said to be desired, as a larger number of inductor windings can be provided for a given tag size. In the embodiment there depicted, the two inductor portions are configured such that when the sheet is folded over to form a capacitor by the alignment of the conductive areas, and the resultant circuit is energized, current flowing in all inductor windings will flow in the same direction. That patent further teaches the desirability of intentionally misaligning the coil windings on the folded-over opposing faces to reduce capacitive coupling between the windings.

It is also known to provide markers wherein no discrete opposing conductive areas are provided which act as capacitor plates and cooperate with a dielectric sheet sandwiched therebetween to form a capacitor. Rather, in such markers, at least one multi-turn spiral configuration is provided on one side of a dielectric sheet and another conductive pattern opposing the spiral is provided on the other side of the sheet. Preferably, matching spiral configurations are provided on opposite sides of the sheet such that the opposing segments of the spirals and sandwiched dielectric sheet form a distributed capacitive element. Such a preferred marker is disclosed in U.S. Pat. No. 4,578,654, issued on Mar. 25, 1986 to William C. Tait and assigned to Minnesota Mining and Manufacturing Company, the assignee of the present application, FIG. 1 of which in particular shows an embodiment wherein similar multi-turn spiral patterns are provided on one side of a dielectric sheet which is subsequently folded to align the spiral patterns, with a double thickness of the dielectric sheet sandwiched therebetween.

SUMMARY OF THE INVENTION

In descriptions pertaining to the folded over configurations shown in U.S. Pat. No. 4,369,557 (Vandebult) and particularly in that shown in FIG. 1 of U.S. Pat. No. 4,578,654, no mention is made specifically concerning the fold-over process, it apparently being assumed to be a simple and perhaps non-demanding process such that even fairly large variations in the location of the fold and hence in the relative placement of the opposing conductive patterns, are of little concern. Indeed in U.S. Pat. No. 4,369,557, Col. 11, lines 9-20, it is suggested that the precise capacitance and inductance are not significant, while at Col. 10, lines 18-33, the possibility of "fine-tuning" the capacitance by repeatedly passing the tag through pressure rollers is suggested.

In contrast, the present invention manifests the recognition that the precise placement of opposing conductive areas is indeed important, and may be critical in enabling the reproducible and inexpensive manufacture of markers having consistent electrical characteristics which vary only over narrow statistical limits. According to the present invention, therefore, means are provided for precisely localizing a fold line about which a thin, flexible polymeric insulative sheet is to be folded back on itself so that when opposite sides are so folded back, opposing portions of a configured electrically conductive layer provided on one surface of the sheet will become precisely aligned. The conductive layer on such a sheet is configured to have three functional parts, some of which may be combined such that a lesser number of structural portions can be identified.

Thus the layer is configured to function as an inductive element, and to so perform has at least one multi-turn spiral. Also, the layer is configured to function in combination with a dielectric sheet as a capacitive element which is electrically coupled to the inductive element to form a circuit resonant at at least one predetermined frequency, and hence has at least two portions, each electrically connected to the spiral and symmetrically positioned on opposite sides of a predetermined fold line such that when the sheet is folded back about that line, the two portions become juxtaposed.

Finally, the layer is also configured to function as the means for precisely localizing the fold line, and thus has at least two other parts, each having a substantially straight side parallel to and spaced a short distance apart to define the fold line therebetween. Each of these parts comprise a contiguous area which stiffens the sheet on both sides of the defined fold line and oppose any tendency of the sheet to fold along any line other than the defined fold line. When so folded, the symmetrically positioned portions thus become precisely positioned opposite to each other, and when the facing surfaces of the sheet are bonded together with the symmetrically positioned portions separated by a dielectric sheet to establish a given spacing between those portions, a predictable capacitance results which varies only over narrow statistical limits, thus enabling control over the fundamental resonant frequency of the resultant resonant circuit within similarly narrow limits.

Preferably, the conductive layer is configured to have at least two multi-turn spirals, one on each side of the fold line. Especially, the two spirals are desirably substantially alike, and each is symmetrically positioned with respect to the other about the fold line. In such an embodiment, the spirals themselves function as the symmetrically positioned portions such that upon folding the sheet back upon itself with a dielectric sheet between the spirals, the spirals and dielectric sheet form a distributed capacitive element.

DESCRIPTION OF THE PREFERRED EMBODIMENT

Figure 1:
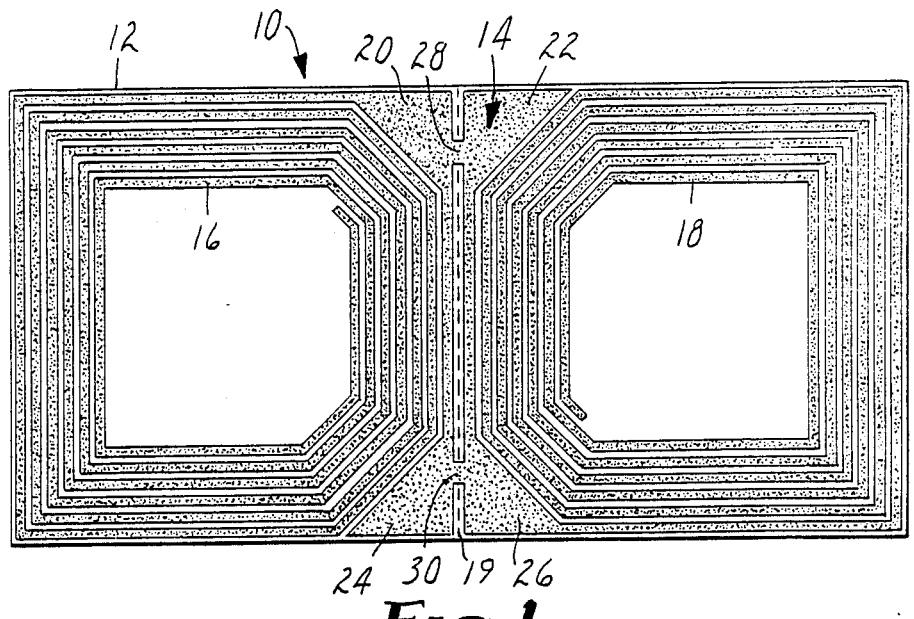
FIG. 1 is a top view of a preform according to the present invention.

As set forth in FIG. 1, a preferred embodiment of the present invention comprises a preform 10 which when folded back upon itself and the facing surfaces bonded together, forms an electrical circuit including at least one inductor and one capacitive element which in combination resonate at at least one fundamental frequency. Such a construction may then be directly used as a marker in an electronic surveillance system. Although not so shown, the construction may be further modified, such as by the addition of an outer layer upon which information identifying the user may be printed, or by the addition of a pressure sensitive adhesive layer to enable the marker to be affixed to the object to be protected.

In the embodiment shown in FIG. 1, the preform 10 comprises a flexible dielectric sheet 12 upon which is affixed an electrically conductive metal layer 14 which has been configured into a number of portions to be further identified. The sheet 12 is preferably a film of a thermoplastic, having both desirable dielectric properties as well as other desirable properties such as being readily bonded to itself and to the metal layer 14, an outer paper covering, adhesive layers, etc. Polyethylene has been found to be particularly desirable. A polyethylene sheet, 0.0009 inch (0.023 mm) thick, when folded back upon itself and the exposed surfaces thermally bonded together, to provide a 0.0018 inch (0.046 mm) thick dielectric layer between the outer metal layers, has been found to result in a desirable capacitive element, wherein the polyethylene provides low dissipation factor and high dielectric strength. A polyethylene sheet is further desirable as it may be directly extruded onto a polyester carrier and the exposed face of the polyethylene subsequently bonded to a metal foil. It is well within the state of the art that other polymeric materials may also be utilized.

If it is desired to fold the insulative sheet 12 back on itself such that the metal layer 14 is on the inward facing surfaces, a separate dielectric sheet may then be inserted between the facing portions of the metal layer 14, and in such an event the dielectric characteristics of the sheet 12 may not be as paramount. Thus, for example, the sheet 12 may be selected to provide an outer protective coating, and a material possessing greater physical strength, tear resistance and the like, such as polyester, would be selected.

The conductive layer 14 is preferably formed of a thin foil of a highly conductive metal, such as copper or aluminum. Preferably, it has been found that a 0.0014 inch (0.036 mm) thick foil of copper or a 0.002 inch (0.050 mm) thick foil of aluminum are desirably utilized. As shown in FIG. 1, the layer 14 is desirably configured to provide two multi-turn spiral portions 16 and 18 respectively, which are symmetrically positioned about a fold line 19. Positioned on opposite sides of the fold line 19 and spaced a short distance therefrom are four triangular portions 20, 22, 24 and 26 respectively. Each of the triangular portions is electrically connected to one of the respective spirals 16 or 18, with the triangular portions 20 and 22 being electrically connected across the fold line via a connecting path 28 while the triangular portions 24 and 26 are connected across the fold line via a connecting portion 30.

Other variations of similar fold over constructions may also be utilized. For example, if desired, a single spiral portion may be provided on one side of a fold line with each end of the spiral connected to areas forming discrete capacitor paths which would be symmetrically positioned on opposite sides of that fold line. Also, if more than two consecutive spiral portions are desired, the dielectric sheet may be extended and the additional spiral patterns affixed to the extended patterns. The dielectric sheet could then be folded in a zig-zag fashion and additional dielectric sheets inserted as necessary, such that the additional spiral patterns become opposed to provide additional capacitive elements.

The metal layer 14 shown in FIG. 1 may be configured utilizing a variety of techniques known to those skilled in the art. Particularly, it is desirable to form the configured pattern via standard printed circuit methods, wherein an original stencil pattern is screen printed with an etch resistance ink onto the metal layer, and the non-ink coated portions are subsequently etched away. Other analogous techniques known to the art may similarly be utilized.

In the embodiment shown in FIG. 1, the outer dimensions of the polyester sheet 12 were approximately 2 inches by 4 inches, (5×10 cm) such that upon folding, a marker approximately 2 inches square (25 cm$^2$) resulted. In such a configuration, the triangular portions 20, 22, 24 and 26 were separated across the fold line by a distance of approximately 0.013 inches, thereby precisely defining the fold line 19. It has been found that if the triangular portions are too close to the edges, it becomes too difficult to fold, while if the triangular portions are spaced too far apart, the fold line is not sufficiently precisely defined and hence an unacceptable error in electrical tolerances results.

A construction having the dimensions set forth above, wherein six turns were provided in each of the spiral portions, as shown in FIG. 1, and wherein each leg was formed with a width of about 1 millimeter and a spacing of about 0.75 millimeters therebetween, was found to provide a fundamental resonant frequency of approximately 4.5 megahertz. The benefit obtained by thus localizing the fold line is especially evident when the properties of a large number of such markers are examined. In one such examination, such markers taken at random from a large production run of over 500,000 markers were found to have a center frequency of 4.5 MHz, with over 95% of all sampled markers being within ±5% of that frequency. Virtually the entire production run of such markers would thus be useable in a system in which the transmitted frequency is varied over a similar range. In systems where only a single frequency is being transmitted, the percent of such markers which would fall within acceptable limits would, of course, be smaller, but still significantly greater than that made by other processes. Indeed, markers made by hand, one at a time, constructed without fold-line defining areas were found to be so far outside a ±5% tolerance level as not to be even remotely practical, either from a reliability or manufacturability aspect.

Figure 2:
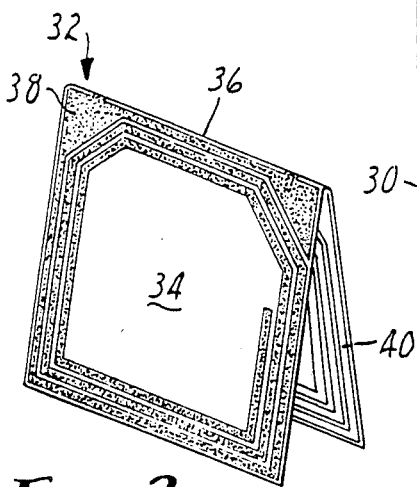
FIG. 2 is a perspective view of a partially formed marker using the preform of FIG. 1.

FIG. 2 sets forth a partially assembled perspective view of a marker similar to that shown as a preform in FIG. 1. As set forth in FIG. 2, the marker 32 comprises a dielectric sheet 34 folded about a fold line 36 such that a multi-turn spiral portion 38 formed of a metal foil adhered to one surface of the sheet 34 falls on one side of the fold line 36 while a similar multi-turn spiral portion 40 is positioned on the opposite side of the fold line. Each of the spiral portions 38 and 40 is substantially the mirror image of the other, such that when the construction is folded about the fold line 36, the respective legs of each spiral precisely oppose each other, and in combination with a double thickness of the polymeric sheet sandwiched therebetween form a distributed capacitor element.

Upon completion of the folding operation as shown in FIG. 2, the facing polymeric surfaces may be bonded together to form the completed marker. As shown in FIG. 2, the multi-turn spiral portion 40 may be seen through the polymeric sheet 34, inasmuch as a sheet 34 may conveniently be formed of a relatively transparent material.

Figure 3:
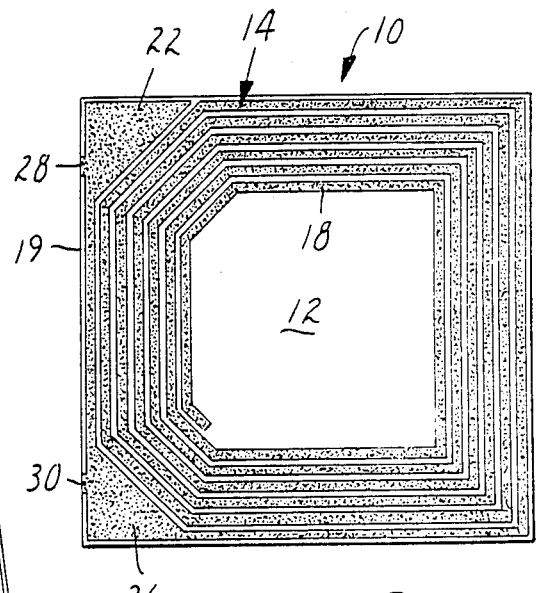

A completed marker formed as discussed above from the preform of FIG. 1, is shown in FIG. 3. As is there shown, the preform 10 has been folded to position the multi-turn spiral portion 16 directly below the spiral portion 18. The facing surfaces of the polyethylene sheet are thermally bonded together to provide a double thickness layer of dielectric separating the opposed metal foil surfaces. Such a circuit is then electrically complete and may be used as a marker without further modification. However, it is generally desired to add to a top surface an outer layer, such as paper so that suitable indicia identifying the customer may be printed thereon. The outer layer is typically cemented or affixed to the exposed foil layer via suitable adhesive. It is also generally desired to have on the opposite surface, a pressure sensitive adhesive, typically further covered with a temporary carrier liner such that the liner may be removed and the adhesive utilized to adhere the marker to objects to be protected.

Figure 4:
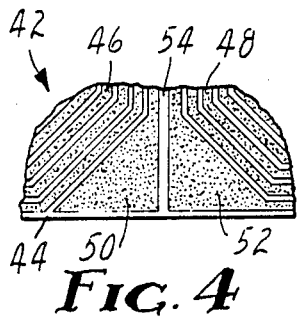
FIG. 3 is a top view of a completed marker formed from the preforms shown in FIGS. 1 and 2 and FIG. 4 is a cutaway view of a portion of a marker having a different configuration from that shown in FIGS. 1 through 3.

A further embodiment of the present invention is shown in the cut away view in FIG. 4. As is there shown, a preform 42 is formed of a dielectric sheet 44 having on one surface thereof a configured metal layer forming matching multi-turn spirals 46 and 48 respectively, an outer turn of which includes portions 50 and 52 which have a substantially straight section opposing each other so as to define a fold line 54 therebetween. In such a regard, this embodiment is substantially like that of the previously discussed embodiment. However, it may be here noted that a link extending across the fold line 54 to connect the triangular areas 50 and 52 is here absent and no electrical connection is present between the two halves of the metal foil pattern.

It has been found that in the embodiments discussed in conjunction with FIGS. 1 through 3, the path connecting the triangular portions 20 and 22 or 24 and 26, such as paths 28 and 30, substantially short out the triangular portions so that those portions do not contribute appreciable capacitance to the overall circuit. Substantially the same resonant frequency thus results so long as the multi-turn spirals are electrically connected via the connecting path extending across the fold line, regardless of whether the triangular portions are totally isolated from the multi-turn spirals, or are totally removed. For example, markers having the connecting paths as discussed above were found to have a resonant frequency of 4.5 MHz. When the triangular pads were removed so that no capacitive contribution could result therefrom, but with the connecting paths remaining, only a slight decrease in the resonant frequency was actually observed. If the triangular portions were functioning as active capacitors, the removal should result in a decrease in capacitance and hence an increase in the resonant frequency would have been expected. On the other hand, when the connecting paths were severed, a significant increase in the resonant frequency to 7.3 MHz was observed. As the opposing portions now function as discrete capacitors, the effective capacitance should be increased, thus lowering the resonant frequency. The increase actually observed is believed to be due to the dominance of the inductive component, and since the two spiral portions are now only indirectly coupled, the net inductance is less, hence the resonant frequency is higher.

Fine adjustment of the capacitance and hence of the resonant circuit formed as discussed hereinabove may further be effected by introducing a separate dielectric layer between the facing polymeric surfaces prior to bonding those surfaces together, such that the layer adds an additional thickness between the opposing metal foil layers. Where such fine adjustments are desired, it has been found preferable to provide such an additional layer as a narrow ribbon, such as a 0.0009 inch thick polyethylene strip, approximately ½ inch wide. Such a ribbon may be gradually introduced between the spiral portions to provide a decrease in the distributed capacitance over that portion of the spirals which are thus further separated. Such a ribbon may, for example, be introduced at one corner of the folded over portion and inserted as far into the corner portion to progressively additionally separate as much of the opposing legs as is necessary in order to modify the capacitance, and hence the resonant frequency, as desired.

I claim:

1. A method of fabricating a marker for use in a radio frequency electronic article surveillance system, said method comprising the steps of:
   (a) providing a flexible polymeric insulative sheet,
   (b) providing on one surface of said sheet an electrically conductive layer configured to form
      (i) at least one multi-turn spiral resulting in an inductive element, (ii) at least two substantially two-dimensionally shaped portions, each electrically connected to said sprial and (iii) each having a substantially straight side parallel to and spaced a short distance from the straight side of another of said portions, leaving therebetween an elongated region in which said conductive layer is substantially absent to define a fold line therebetween, the two-dimensional shape of each of said two parts serving to thereby stiffen said sheet on opposite sides of said fold line to promote subsequent folding only along said fold line, (c) folding said sheet back on itself, said two straight-sided portions stiffening the sheet on both sides of the fold line thereby opposing any tendency of the sheet to fold along any line other than said predetermined fold line and precisely localizing the fold such that said two portions become precisely positioned opposite each other with a dielectric sheet sandwiched therebetween to form at least one capacitive element, and (d) bonding the facing surfaces together to thereby establish a given spacing between the positioned portions and hence a predictable capacitance for the resultant capacitive element, said capacitive element and inductive element in combination forming a circuit resonant at at least one resonant frequency.

2. A method according to claim 1, wherein the step of providing a configured electrically conductive layer further comprises providing at least one electrically conductive path extending across said fold line to connect portions of said configured layer lying on each side of said line.

3. A method according to claim 1, comprising configuring said layer to form at least two multi-turn spirals, one on each side of said fold line.

4. A method according to claim 3, comprising further configuring said layer to provide at least one electrical path extending across said fold line to connect said two multi-turn spirals.

5. A method according to claim 3, comprising configuring said multi-turn spirals to be substantially alike, each being symmetrically positioned with respect to said fold line such that upon folding said sheet back upon itself with a dielectric sheet lying between the spirals, the spirals and dielectric sheet form a distributed capacitive element.

6. A method according to claim 3, comprising configuring each of said multi-turn spirals with substantially straight segments parallel to said fold line, with the outermost straight segments also encompassing one of the straight-sided portions.

7. A method according to claim 1, comprising providing as said insulative sheet a sheet having preselected dielectric properties and folding said sheet back upon itself such that the conductive layer on each side of the fold line remain on the outside, separated by two thicknesses of the dielectric sheet and bonding the facing surfaces together.

8. A method according to claim 1, further comprising folding said sheet back on itself with the conductive layer on each side of the fold line facing inward, inserting a dielectric sheet between the inward facing surfaces of the insulative sheet and bonding the resultant sandwich together.

9. A preform for use in forming a marker for use in a radio frequency electronic article surveillance system, said preform comprising:

(a) a flexible polymeric insulative sheet and (b) an electrically conductive layer affixed to one surface of said sheet and configured to form (i) at least one multi-turn spiral resulting in an inductive element, (ii) at least two substantially two-dimensionally shaped portions, each electrically connected to said sprial and short distance from the straight side of another of said portions, leaving therebetween an elongated region in which said conductive layer is substantially absent to define a fold line therebetween, the two-dimensioned shape of each of said parts serving to thereby stiffen said sheet on opposite sides of said fold line such that when said sheet is folded back on itself said parts cooperatively oppose any tendency of the sheet to fold along any line other than said fold line and precisely localize the fold such that when the inner surface of the sheet is either bonded together or is indirectly joined via at least one additional layer therebetween, said two symmetrically positioned portions become precisely juxtaposed opposite each other with a dielectric layer therebetween to form a capacitive element having a predictable capacitance which in combination with said inductive element forms said resonant circuit.

10. A preform according to claim 9, wherein said electrically conductive layer further comprises at least one electrically conductive path extending across said fold line and connecting portions of said configured layer lying on each side of said line.

11. A preform according to claim 9, wherein said layer is configured to form at least two multi-turn spirals, one on each side of said fold line.

12. A preform according to claim 11, wherein said layer is further configured to provide at least one electrical path extending across said fold line to connect said two multi-turn spirals.

13. A preform according to claim 11, wherein said multi-turn spirals are substantially alike and each is symmetrically positioned with respect to said fold line such that upon folding said sheet back upon itself with a dielectric sheet lying between the spirals, the spirals and dielectric sheet form a distributed capacitive element.

14. A preform according to claim 11, wherein said insulative sheet comprises a sheet having preselected dielectric properties.

15. A preform according to claim 11, wherein each of said multi-turn spirals comprise substantially straight segments parallel to said fold line, with the outermost straight segment also, encompassing one of the straight-sided portions.

16. A marker for use in a radio frequency electronic article surveillance system, said marker containing a circuit resonant at at least one radio frequency, and comprising a flexible polymeric insulative sheet folded back on itself about a predetermined fold line with the inner surface being either directly bonded together or being indirectly joined via at least one additional layer therebetween, said sheet having on one surface an electrical conductive layer configured to form (i) at least one multi-turn spiral resulting in an inductive element, (ii) at least two substantially two-dimensionally shaped portions, each electrically connected to said spiral, symmetrically positioned on an opposite side of said fold line thereby being juxtaposed and having sandwiched therebetween a dielectric layer to form a capacitive element, and each having a substantially straight side parallel to and spaced a short distance from the straight side of another of said portions, leaving therebetween an elongated region in which said conductive layer is substantially absent, the two-dimensional shape of, each of said two parts serving to thereby stiffen said sheet and to thereby cooperatively oppose any tendency of said sheet to fold along any line other than said fold line and to precisely localize the fold such that the two symmetrically positioned portions are precisely juxtaposed opposite each other to result in a predictable capacitance for said capacitive element which in combination with said inductive element form said circuit resonant at at least one resonant frequency.

17. A marker according to claim 16, wherein said electrically conductive layer further comprises at least one electrically conductive path extending across said fold line to connect portions of said configured layer lying on each side of said line.

18. A marker according to claim 16, wherein said layer is configured to form at least two multi-turn spirals, one on each side of said fold line.

19. A marker according to claim 18, wherein said layer is further configured to provide at least one electrical path extending across said fold line to connect said two multi-turn spirals.

20. A marker according to claim 18, wherein said multi-turn spirals are substantially alike and each is symmetrically positioned with respect to said fold line such that upon folding said sheet back upon itself with a dielectric sheet lying between the spirals, the spirals and dielectric sheet form a distributed capacitive element.

21. A marker according to claim 18, wherein said insulative sheet comprises a sheet having preselected dielectric properties, which sheet is folded back upon itself and the facing surfaces bonded together such that the conductive layer on each side of the fold line remains on the outside, separated by two thicknesses of the dielectric sheet.

22. A marker according to claim 18, wherein said multi-turn spirals comprise substantially straight segments parallel to said fold line, with the outermost straight segment also encompassing one of the straight-sided portions.

23. A method of fabricating a resonant marker for use in a radio frequency electronic article surveillance system, said marker having at least one radio frequency tuned circuit with integrally formed inductive and capacitive elements, the method comprising the steps of:
(a) providing flexible polymeric dielectric substrate of predetermined thickness and dielectric characteristics and having first and second faces;
(b) providing on one of said faces a conductive circuit pattern defining at least two multi-turn inductive portions, each portion being substantially alike and symmetrically positioned with respect to a reference line extending therebetween, and spiraling inwardly from the outer edges of the substrate in opposite directions, an outermost leg of each inductive portion further having a substantially two-dimensionally shape which includes a straight side which is parallel to the straight side of the matching leg of the other portion and is spaced a short distance therefrom, leaving therebetween an elongated region in which said conductive pattern is substantially absent to precisely define said reference line therebetween;
(c) folding said substrate and said circuit pattern thereon about said reference line such that a double layer of the substrate lies between the folded portions of the circuit pattern and the respective windings of the respective inductive portions become precisely aligned with each other, the aligned portions and the dielectric substrate therebetween thus forming a distributed capacitive element, while the opposing conductive areas adjacent the said reference line form respective plates of at least one discrete capacitive element, the individual capacitive element and the distributed capacitive element adding to form the total capacitance of the tuned circuit; and
(d) bonding together the double layer of the substrate at least in the region over which the portions are mutually aligned, thereby fixing the capacitance of the respective capacitive components.

24. A marker for use in a radio frequency electronic article surveillance system, said marker having at least one radio frequency tuned circuit with integrally formed inductive and capacitive elements comprising, a flexible polymeric dielectric substrate of predetermined thickness and dielectric characteristics and having first and second faces and an electrically conductive circuit pattern affixed to one of said faces and defining at least two multi-turn inductive portions, each portion being substantially alike and symmetrically positioned with respect to a reference line extending therebetween, and spiraling inwardly from the outer edges of the substrate in opposite directions, an outermost leg of each inductive portion further having a substantially two-dimensional shape which includes a straight side which is parallel to the straight side of the matching leg of the other portion and is spaced a short distance therefrom, leaving therebetween an elongated region in which said conductive pattern is substantially absent to precisely define said reference line therebetween, wherein said substrate is folded about said reference line and the facing surfaces are bonded together such that a double layer of the substrate lies between the folded portions of the circuit pattern and the respective windings of the respective inductive portions are precisely aligned with each other, the aligned portions and the dielectric substrate therebetween thus forming a distributed capacitive element, while the opposing conductive areas adjacent the said reference line form respective plates of at least one discrete capacitive element, the individual capacitive element and the distributed capacitive element adding to form the total capacitance of the tuned circuit.

* * * * *

UNITED STATES PATENT AND TRADEMARK OFFICE
CERTIFICATE OF CORRECTION

PATENT NO. : 4,658,264

DATED : April 14, 1987

INVENTOR(S) : Dennis L. Baker

It is certified that error appears in the above-identified patent and that said Letters Patent is hereby corrected as shown below:

Col. 7, line 4, "iii)" should be deleted with no paragraph break occurring.

Col. 8, line 11, after "and" insert --each having a substantially straight side parallel to and spaced a--.

Signed and Sealed this

Twenty-third Day of February, 1988

Attest:

DONALD J. QUIGG

Attesting Officer

Commissioner of Patents and Trademarks